United States Patent
Kawazu

(10) Patent No.: US 9,935,025 B2
(45) Date of Patent: Apr. 3, 2018

(54) ELECTRONIC COMPONENT HOUSING PACKAGE AND ELECTRONIC DEVICE

(71) Applicant: KYOCERA Corporation, Kyoto-shi, Kyoto (JP)

(72) Inventor: Yoshiki Kawazu, Kyoto (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 15/122,475

(22) PCT Filed: Mar. 13, 2015

(86) PCT No.: PCT/JP2015/057493
§ 371 (c)(1),
(2) Date: Aug. 30, 2016

(87) PCT Pub. No.: WO2015/137489
PCT Pub. Date: Sep. 17, 2015

(65) Prior Publication Data
US 2017/0069556 A1 Mar. 9, 2017

(30) Foreign Application Priority Data
Mar. 13, 2014 (JP) .................................. 2014-050298

(51) Int. Cl.
*H01L 23/057* (2006.01)
*H01L 23/373* (2006.01)
(Continued)

(52) U.S. Cl.
CPC .......... *H01L 23/057* (2013.01); *H01L 23/373* (2013.01); *H01L 31/0203* (2013.01);
(Continued)

(58) Field of Classification Search
CPC ......... H01L 2924/0002; H01L 2924/00; H01L 23/057; H01L 23/373; H01L 31/02005;
(Continued)

(56) References Cited

U.S. PATENT DOCUMENTS 6,365,961 B1 * 4/2002 Tomie ................... H01L 23/66
257/664
6,369,324 B1 * 4/2002 Tomie ................... H01L 23/66
174/541
(Continued)

FOREIGN PATENT DOCUMENTS

JP  11-214556 A  8/1999
JP  11214556 A * 8/1999
(Continued)

OTHER PUBLICATIONS

International Search Report, PCT/JP2015/051493, dated Jun. 2, 2015, 1 pg.
(Continued)

*Primary Examiner* — Sophia Nguyen
(74) *Attorney, Agent, or Firm* — Volpe and Koenig, P.C.

(57) ABSTRACT

An electronic component housing package includes a substrate having an upper surface including a mount region on which an electronic component is to be mounted; a frame body disposed on the upper surface of the substrate, the frame body being provided with a through-hole portion; and an input/output member disposed on the frame body so as to block the through-hole portion, the input/output member having wiring conductors which are to be electrically connected to the electronic component, the wiring conductors extending to an inside and outside of the frame body and also extending along a lower surface of the input/output member on the outside of the frame body. The input/output member is provided with a cutout portion which is cut out so as to extend from a gap between the wiring conductors on the lower surface along the wiring conductors to an outer side surface of the input/output member.

4 Claims, 8 Drawing Sheets

(51) Int. Cl.
  *H01L 31/02* (2006.01)
  *H01L 31/0203* (2014.01)
  *H01L 31/0232* (2014.01)
  *H01L 31/024* (2014.01)
  *H01S 5/022* (2006.01)
  *H01S 5/024* (2006.01)

(52) U.S. Cl.
  CPC ...... *H01L 31/024* (2013.01); *H01L 31/02005* (2013.01); *H01L 31/02325* (2013.01); *H01S 5/02212* (2013.01); *H01S 5/02284* (2013.01); *H01S 5/02469* (2013.01); *H01L 2924/0002* (2013.01)

(58) Field of Classification Search
  CPC ........... H01L 31/0203; H01L 31/02325; H01L 31/024; H01S 5/02212; H01S 5/02469
  See application file for complete search history.

(56) References Cited

U.S. PATENT DOCUMENTS

| | | | | |
|---|---|---|---|---|
| 6,796,725 | B2* | 9/2004 | Velsher | G02B 6/4248 385/92 |
| 6,992,250 | B2* | 1/2006 | Kubota | H01L 23/047 174/549 |
| 7,284,913 | B2* | 10/2007 | Powers | G02B 6/4238 385/14 |
| 8,405,200 | B2* | 3/2013 | Ueda | H01L 23/047 257/692 |
| 9,059,516 | B2* | 6/2015 | Zhu | H01Q 13/206 |
| 9,237,662 | B2* | 1/2016 | Satake | H01L 23/057 |
| 9,351,422 | B2* | 5/2016 | Tanaka | H01L 23/04 |
| 9,408,307 | B2* | 8/2016 | Tsujino | H01L 23/057 |
| 9,516,770 | B2* | 12/2016 | Kanchiku | H01R 13/405 |
| 9,585,264 | B2* | 2/2017 | Tanaka | H01L 23/057 |
| 9,603,274 | B2* | 3/2017 | Shibayama | H01L 23/053 |
| 9,640,452 | B2* | 5/2017 | Tsujino | H01L 23/047 |
| 2004/0184239 | A1* | 9/2004 | Zimmerman | H01L 21/50 361/712 |
| 2005/0207092 | A1* | 9/2005 | Kubota | H01L 23/047 361/301.3 |
| 2011/0048796 | A1* | 3/2011 | Tsujino | H01L 23/49833 174/549 |
| 2012/0147539 | A1* | 6/2012 | Tsujino | H01L 23/057 361/679.01 |
| 2013/0128489 | A1* | 5/2013 | Satake | H01L 23/057 361/820 |
| 2013/0322036 | A1* | 12/2013 | Tsujino | H01L 23/057 361/752 |
| 2014/0008780 | A1* | 1/2014 | Tsujino | H01L 23/057 257/690 |
| 2014/0368998 | A1* | 12/2014 | Tanaka | H01L 23/04 361/688 |
| 2015/0016074 | A1* | 1/2015 | Tsujino | H01L 23/057 361/749 |
| 2015/0195935 | A1* | 7/2015 | Shibayama | H05K 5/0247 361/807 |
| 2016/0104650 | A1* | 4/2016 | Tsujino | H01L 23/057 257/693 |
| 2016/0120026 | A1* | 4/2016 | Kawazu | H05K 1/025 333/5 |
| 2017/0069556 | A1* | 3/2017 | Kawazu | H01L 23/057 |

FOREIGN PATENT DOCUMENTS

| | | | |
|---|---|---|---|
| JP | 2004-153165 A | 5/2004 | |
| JP | 2006-210672 A | 8/2006 | |
| JP | 2014-027158 A | 2/2014 | |
| WO | 2012/029703 A1 | 3/2012 | |
| WO | WO 2013111752 A1 * | 8/2013 | ............ H01L 23/04 |
| WO | WO 2013141013 A1 * | 9/2013 | ............ H01L 23/057 |

OTHER PUBLICATIONS

Extended European Search Report, European Application No. 15761347.2, dated Oct. 16, 2017, 8 pgs.
Japanese Office Action with English concise explanation, Japanese Patent Application No. 2016-507849, dated Sep. 2017, 5 pgs.

* cited by examiner

ELECTRONIC COMPONENT HOUSING PACKAGE AND ELECTRONIC DEVICE

TECHNICAL FIELD

The present invention relates to an electronic component housing package and an electronic device.

BACKGROUND ART

As an electronic component housing package for housing an electronic component (hereinafter, also simply referred to as a package), for example, a package described in Patent Literature 1is known. The package described in Patent Literature 1 has leads connected to a bottom surface of a dielectric base material. In addition, a part of a lower surface of the leads is cut out.

CITATION LIST

Patent Literature

Patent Literature 1: Japanese Unexamined Patent Publication JP-A 2004-153165

SUMMARY OF INVENTION

Technical Problem

The package described in Patent Literature 1 has an increased distance between the leads and an external circuit board when the leads are mounted on the external circuit board, thereby reducing capacity coupling between the leads and the external circuit board. However, capacity coupling created between adjacent leads via the dielectric base material cannot be largely reduced.

Accordingly, the leads cannot be disposed at a high density. This reason is why capacity coupling between leads is increased if the leads are disposed at a high density.

The invention has been devised in consideration of the above problems, and an object thereof is to provide an electronic component housing package which has good electric properties, and an electronic device employing the same.

Solution to Problem

An electronic component housing package according to an embodiment of the invention includes a substrate having an upper surface including a mount region on which an electronic component is to be mounted; a frame body disposed on the upper surface of the substrate so as to surround the mount region, the frame body being provided with a through-hole portion which opens to an inside and outside of the frame body; and an input/output member disposed on the frame body so as to block the through-hole portion, the input/output member having a plurality of wiring conductors which are to be electrically connected to the electronic component, the wiring conductors extending to the inside and outside of the frame body and also extending along a lower surface of the input/output member on the outside of the frame body, the input/output member being provided with a cutout portion which is cut out so as to extend from a gap between the plurality of wiring conductors on the lower surface along the wiring conductors to an outer side surface of the input/output member.

An electronic device according to an embodiment of the invention includes the electronic component housing package mentioned above; an electronic component which is mounted on the mount region of the electronic component housing package and is electrically connected to the wiring conductors via a connection member; and a lid body which is bonded to an upper surface of the frame body and seals the electronic component.

Advantageous Effects of Invention

According to the invention, the input/output member has the cutout portion which is cut out so as to extend from the gap between the plurality of wiring conductors along the wiring conductors to the outer side surface of the input/output member. Accordingly, it is possible to provide a compact electronic component housing package which has a good high-frequency property and disposes wiring conductors closely to each other, and an electronic device employing the same.

Description of Embodiments

Hereinafter, an electronic device 1 and an electronic component housing package 10 according to an embodiment of the invention will be described with reference to the accompanying drawings.

<Configuration of Electronic Device>

Figure 1:
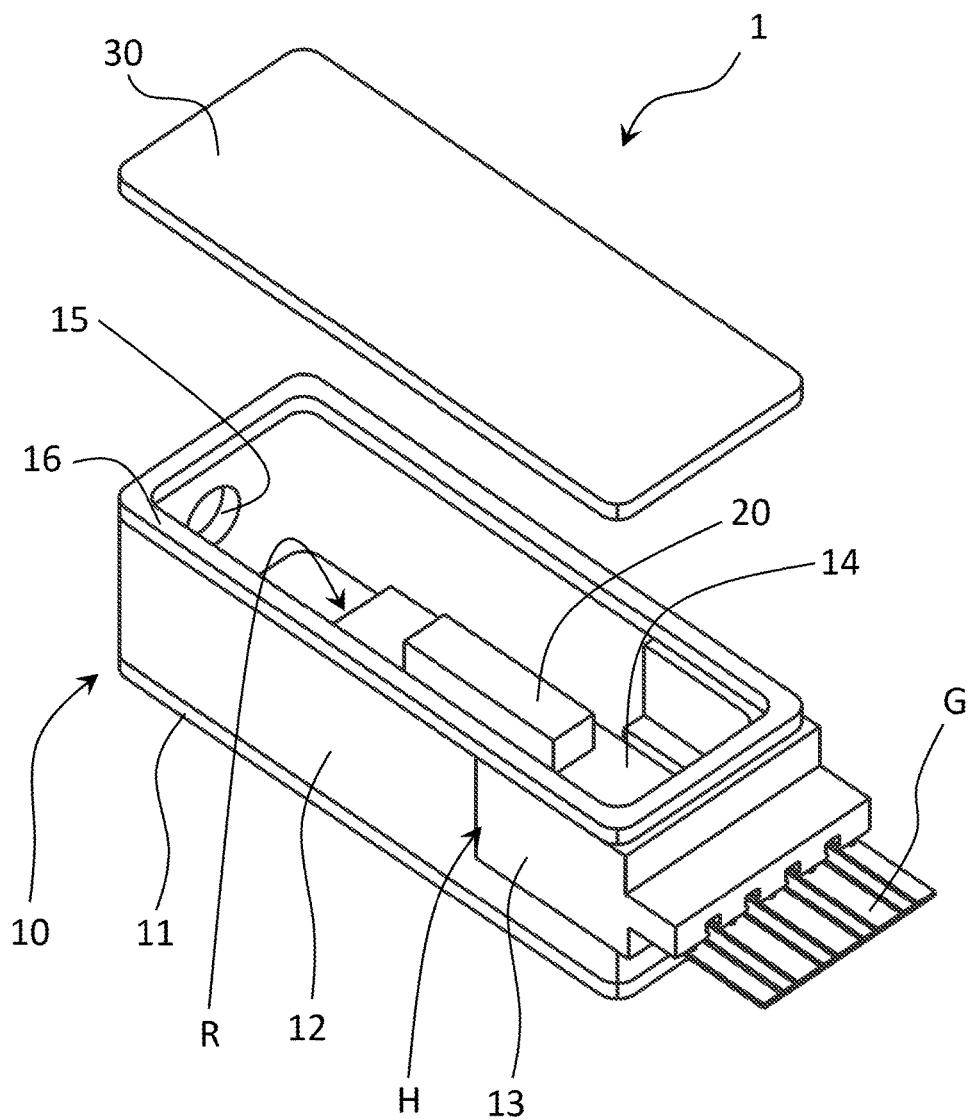
FIG. 1 is an exploded perspective view showing an electronic device according to an embodiment of the invention, in a state where a lid body thereof is separated.

FIG. 1 is an exploded perspective view showing an electronic device 1 according to an embodiment of the invention. As shown in FIG. 1, the electronic device 1 according to an embodiment of the invention includes an electronic component housing package 10, an electronic component 20 mounted on the electronic component housing package 10 and a lid body 30 which seals the electronic component 20.

The electronic component housing package 10 includes a substrate 11, a frame body 12 and an input/output member 13 fixed on the frame body 12. The substrate 11 has, on an upper surface thereof, a mount region R on which the electronic component 20 is to be mounted. The frame body 12 is disposed on an upper surface of the substrate 11 so as to surround the mount region R. Also, the frame body 12 is provided with a through-hole portion H which opens to an inside and outside of the frame body 12. The input/output member 13 is disposed on the frame body 12 so as to block the through-hole portion H provided in the frame bode 12. Also, the input/output member 13 has a plurality of wiring conductors 131 which are to be electrically connected to the electronic component 20. The wiring conductors 131 are provided so as to extend to the inside and outside of the frame body 12 and extend along a lower surface of the input/output member 13 on the outside of the frame body 12. In addition, the input/output member 13 is provided with cutout portions C which are cut out so as to extend from gaps between the plurality of wiring conductors 131 on a lower surface along the wiring conductors 131 to an outer side surface of the input/output member 13.

The substrate 11 is a member for air-tightly sealing the electronic component 20 together with the frame body 12, the input/output member 13 and the lid body 30. The substrate 11 is a plate-shaped member having, for example, a quadrangular shape as viewed in a plan view. The plan-view shape of the substrate 11 is not limited to the quadrangular shape, but may be of various shapes according to the purpose of the substrate 11. The substrate 11 has, on the upper surface thereof, the mount region R in which the electronic component 20 is to be mounted. In the present embodiment, a mounting board 14 is installed on the upper surface of the substrate 11 and in turn the electronic component 20 is mounted on an upper surface of the mounting board 14. In this case, the mount region R means a region in which the mounting board 14 is overlapped with the substrate 11 when the substrate 11 is viewed in a plan view.

For the substrate 11, a metal material such as iron, copper, nickel, chromium, cobalt, molybdenum or tungsten, may be employed. Alternatively, an alloy or composite material made of these metals may be employed. The substrate 11 may also have a function of emitting heat generated by the electronic component 20. In this case, it is preferable to employ a material having a good heat conductivity. The substrate 11 can be manufactured by performing a metal working process such as rolling or punching, on an ingot of the metal material.

For the mounting board 14, a material having a good insulating property is employed. As a material for forming the mounting board 14, for example, a ceramic material such as an aluminum oxide sintered body, a mullite sintered body, a silicon carbide sintered body, an aluminum nitride sintered body or a silicon nitride sintered body, may be employed.

The frame body 12 is a member which houses the electronic component 20 together with the substrate 11. The frame body 12 forms a recess portion for housing the electronic component 20 together with the substrate 11. Also, the frame body 12 is a member which holds the input/output member 13.

The frame body 12 is disposed on the upper surface of the substrate 11 so as to surround the mount region R of the substrate 11. In the present embodiment, the frame body 12 has inner and outer peripheral shapes each being of a quadrangle as viewed in a plan view. The plan-view shape of the frame body 12 is likely to have a shape resembling the plan-view shape of the substrate 11, but is not limited to that and accordingly may be of various shapes according to the purpose of the frame body 12. The frame body 12 is disposed on the upper surface of the substrate 11 so as to surround the mount region R and is provided with the through-hole portion H which opens to the inside and outside of the frame body 12. The through-hole portion H is provided in a direction extending along the upper surface of the substrate 11. The input/output member 13 is fixed so as to block the through-hole portion H.

For the frame body 12, a metal material such as iron, copper, nickel, chromium, cobalt or tungsten, may be employed. Alternatively, an alloy made of these metals may be employed. The frame body 12 can be manufactured by performing a metal working process such as rolling, punching or cutting, on an ingot of the metal material.

In the present embodiment, the frame body 12 is provided with an opening portion 15 on a part of the frame opposing the through-hole portion H. A holding member (not shown) is fixed in the opening portion 15. A light transmitting member or an optical fiber is fixed on the holing member via a bonding material such as a brazing material. The holding member is a cylindrical member. The holding member is configured to fix the light transmitting member to be attached on an inner side or end portion of the holding member. In addition, the optical fiber is attached on an outer side of the light transmitting member. The holding member is provided so as to optically couple the optical fiber with the electronic component 20 and thus to allow an optical signal to be inputted and outputted therebetween.

For the holding member, a metal material such as iron, copper, nickel, chromium, cobalt or tungsten, may be employed. Alternatively, an alloy made of these metals may be employed. The holding member can be manufactured by performing a metal working process such as rolling, punching or cutting, on an ingot of the metal material.

The frame body 12 and the holding member are preferably formed of the same metal material. In this way, a difference in thermal expansion between the frame body 12 and the holding member can be reduced. As a result, it is possible to reduce a stress occurred between the frame body 12 and the holding member and deformation of the holding member under heat cycles during manufacturing processes, use or the like of the electronic component hosing package 10.

The input/output member 13 is connected to an external circuit board G or the like. The input/output member 13 is a member which electrically connects the inside and outside of the electronic component housing package 10. The input/output member has a metallization layer formed in a site thereof to be bonded to the through-hole portion H. Also, the input/output member 13 is fixed to the through-hole portion H of the frame body 12 via the metallization layer and a bonding material such as a brazing material, thereby blocking the through-hole portion H.

Figure 5:
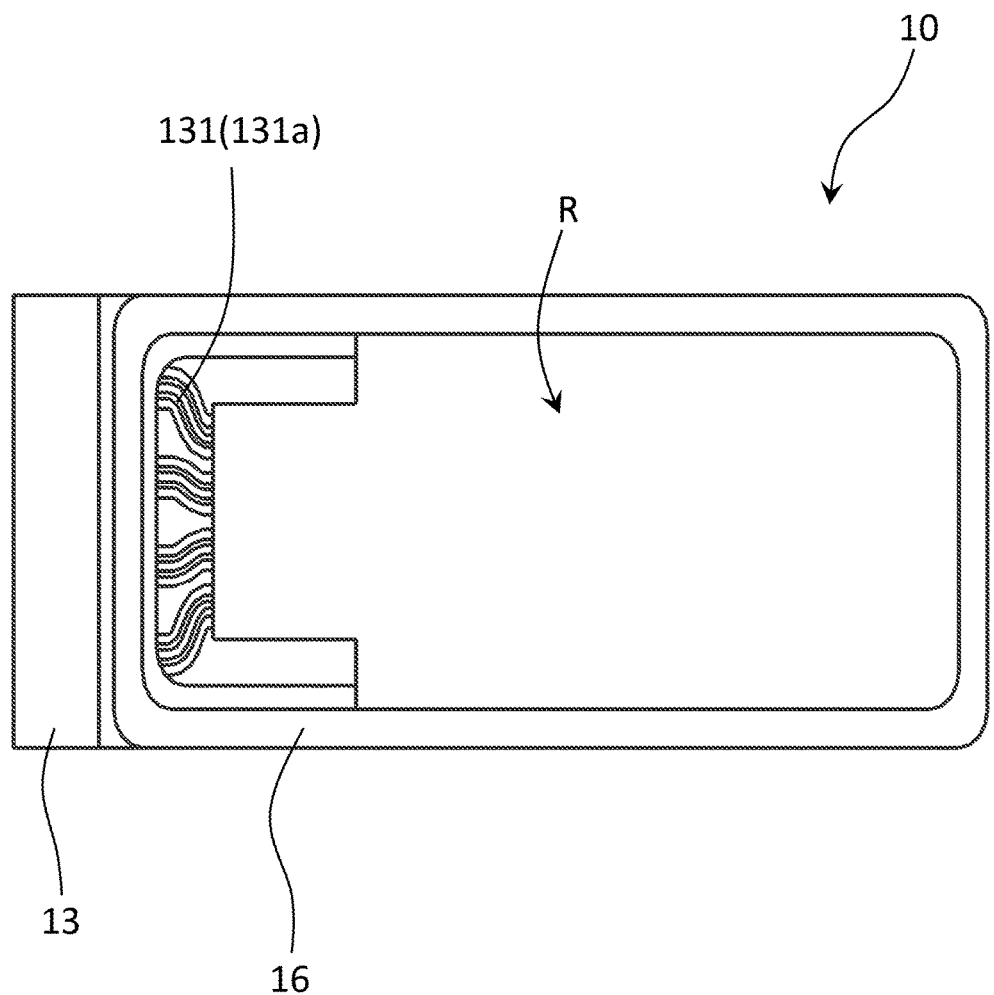
FIG. 5 is a top view of the electronic component housing package.

The input/output member 13 is disposed so that one end thereof is positioned inside the frame body 12 and the other end is positioned outside the frame body 12. As shown in FIG. 5, the input/output member 13 is cut out in a concave shape on a side thereof facing the mount region R, as viewed in a plan view. The input/output member 13 has the plurality of wiring conductors 131 extending to the inside and outside of the frame body 12. The wiring conductors 131 extend along the upper surface of the input/output member 13 on the inside of the frame body 12 and are electrically connected to the electronic component 20 by a bonding wire as a connection member or the like. In addition, the wiring conductors 131 comprise signal lines for transmitting a high-frequency signal therethrough, and ground conductors serving as a reference potential.

Figure 4:
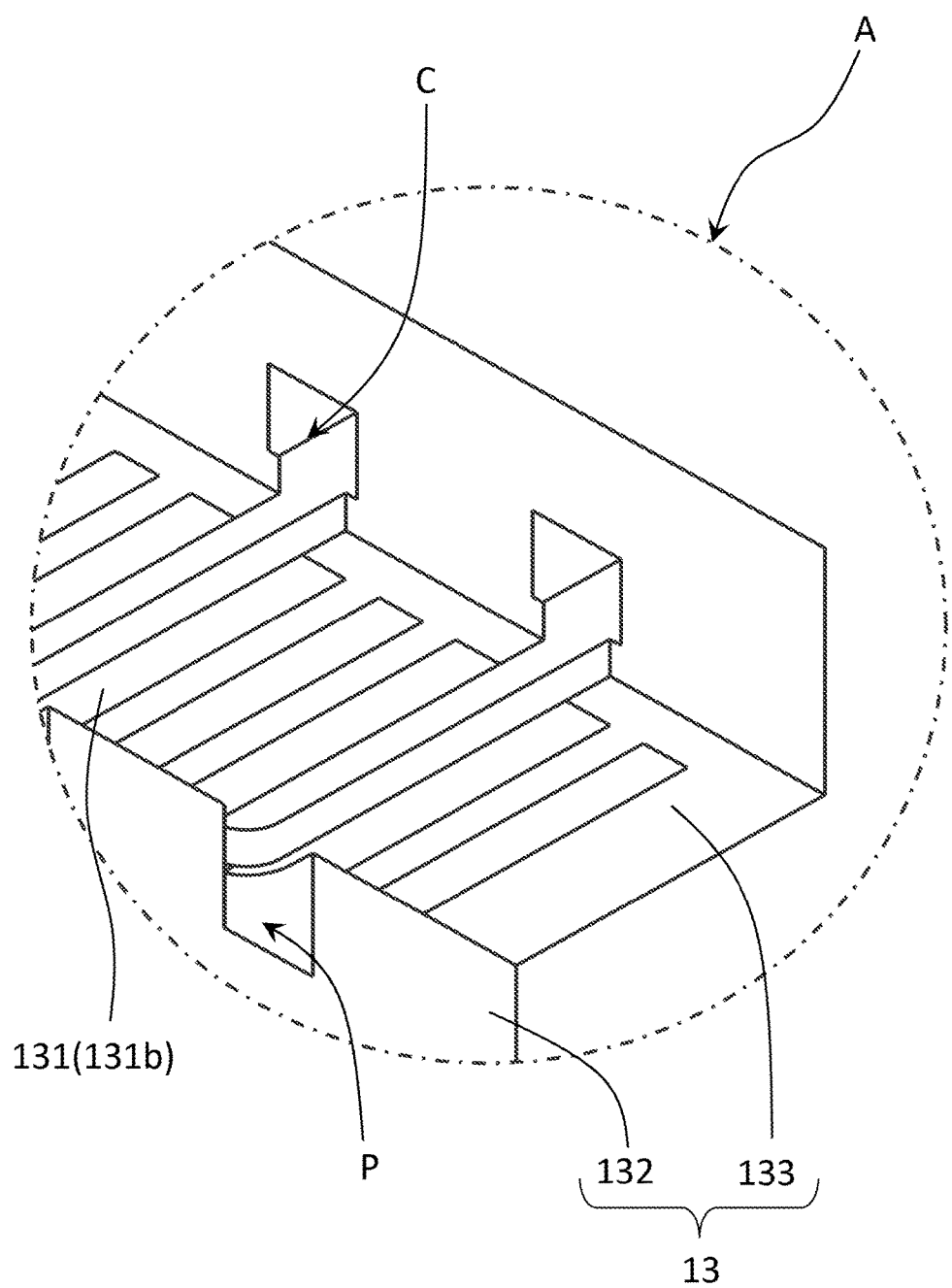
FIG. 4 is an partial enlarged external perspective view showing a main part A of FIG. 3.
Figure 7:
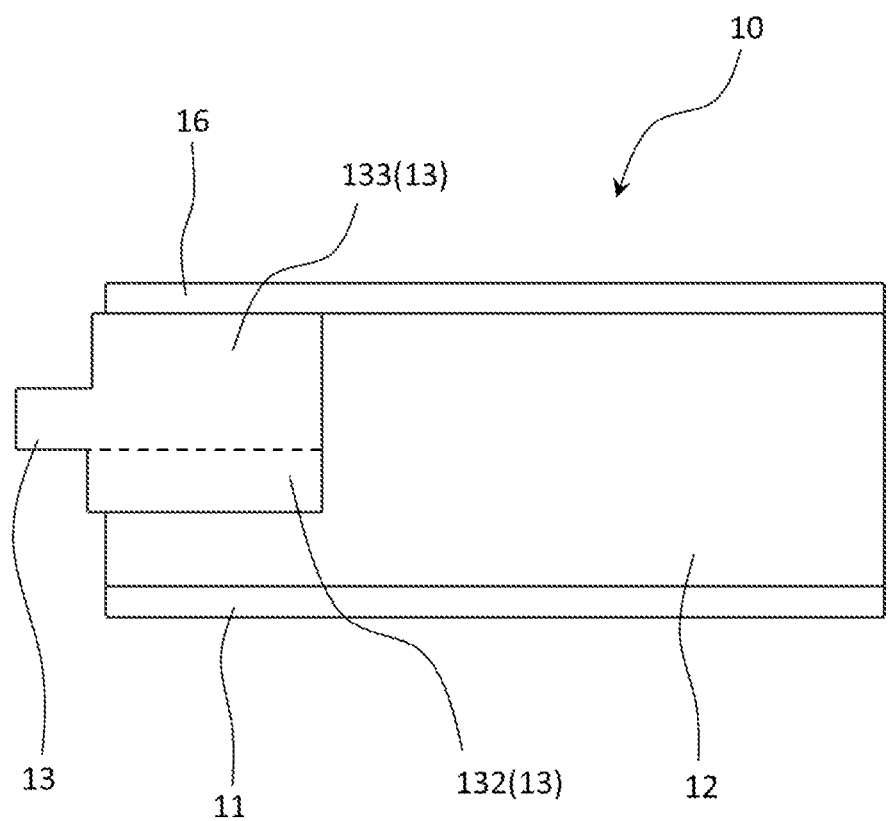
FIG. 7 is a side view of the electronic component housing package.

The input/output member 13 has a structure in which a plurality of insulating layers are stacked on top of one another, and the wiring conductors 131, which become the signal line or the ground conductor, are formed between the plurality of insulating layers. Also, as shown in FIGS. 4, 7 and 8, the input/output member 13 includes, as parts of the plurality of insulating layers, a first insulating layer 132 having a board shape and a second insulating layer 133 disposed on the first insulating layer 132. It should be noted that the first insulating layer 132 and the second insulating layer 133 are distinguished for the sake of convenience and actually integrally formed with each other.

The first insulating layer 131 is one layer of the stacked body of the input/output member 13. The first insulating layer 132 is configured so that an outer side surface thereof does not protrude beyond the second insulating layer 133 toward the outside of the frame body 12. Accordingly, a part of a lower surface of the second insulating layer 133 is exposed on the outside of the frame body 12. Namely, the input/output member 13 is of a shape in which a lower side thereof on the outside of the frame body 12 is cut out to an end surface of the input/output member 13.

Also, the first insulating layer 132 is a plate-shaped member. The first insulating layer 132 is of a quadrangular shape and also has a plan-view shape in which a middle portion of one side of an inner portion thereof surrounded by the frame body 12 is cut out in a U-shape along inner sides of the frame body 12.

The second insulating layer 133 is staked on the upper surface of the first insulting layer 132 disposed on the inside and outside of the frame body 12. On the outside of the frame body 12, the second insulating layer 133 protrudes beyond the first insulating layer 132 toward the outside of the frame body 12. Also, on a lower surface of the second insulating layer 133, the plurality of wiring conductors 131 are formed to be led out from the inside of the frame body 12.

The second insulating layer 133 is a plate-shaped member. Like the first insulating layer 132, the second insulating layer 133 also has a plan-view shape in which a middle portion of one side of a quadrangular shape is cut out in a U-shape along the inner sides of the frame body 12. Also, a plurality of cutout portions C cut out in a groove shape are formed on a lower surface of the second insulating layer 133. The cutout portions C is formed so as to extend gaps between the wiring conductors 131 along the wiring conductors 131 to the outer side surface of the frame body 12.

Meanwhile, if the second insulating layer 133 has a multilayer stacked structure, a width of the cutout portion C in a depth direction can be adjusted. For example, the cutout portion C may be formed in such a two-stepped shape that a width of an inner side of the cutout portion C is larger than a width of an opening portion of the cutout portion C.

Also, the upper surface of the second insulating layer 133 may be provided with a U-shaped insulating member matched with the shape of the frame body 12 as viewed in a plan view. In this way, the electronic component housing package 10 can be air-tightly sealed with the frame body 12 and the wiring conductors 131 electrically insulated from each other.

For the first insulating layer 132 and the second insulating layer 133, a material having a good insulating property is employed. As a material for forming the first insulating layer 132, for example, a ceramic material such as an aluminum oxide sintered body, a mullite sintered body, a silicon carbide sintered body, an aluminum nitride sintered body or a silicon nitride sintered body, may be employed. In addition, the first insulating layer 132 and the second insulting layer 133 are integrally formed with each other, by machining green sheets which contain particles made of such a ceramic material, into a desired shape, applying a metal paste which contains a high-melting point metal material to become the wiring conductors 131, into a desired wiring pattern, and then stacking and co-firing them.

As shown in FIG. 5, wiring conductors 131 are disposed on the upper surface of the first insulating layer 132 located inside the frame body 12. The wiring conductors 131 are electrically connected to the electronic component 20 via a bonding wire as a connection member or the like. The wiring conductors 131 are composed of a plurality of wirings and extend from the inside of the frame body 12 to the outside of the frame body 12. Meanwhile, the wiring conductors 131 are made of a high-melting point metal material such as tungsten, molybdenum, or manganese. Wiring conductors 131 are also disposed on the lower surface of the second insulating layer 133 located outside the frame body 12. The wiring conductors 131 formed on the upper surface of the first insulating layer 132 and the wiring conductors 131 formed on the lower surface of the second insulating layer 133 are electrically connected to each other. As the wiring conductors 131 formed on the upper surface of the first insulating layer 132 and on the lower surface of the second insulating layer 133 are stacked so as to be overlapped with each other, wiring conductors 131a and 131b formed on both layers 132 and 133 can be electrically connected to each other.

The input/output member 13 is configured so that in a portion thereof in which the cutout portions C are disposed on the lower surface of the second insulating layer 133, an electric capacity created between the wiring conductors 131 becomes small. The cutout portions C serve as an air layer. In this way, the air layer which constitutes the second insulating layer 133 and has a dielectric constant smaller than the ceramic material can be interposed between the wiring conductors 131, thereby increasing a characteristic impedance $\{Zo=\sqrt{(L/C)}\}$ of the wiring conductors 131. As a result, even if distances between the wiring conductors 131 are decreased or widths thereof are increased, it is easy to make the characteristic impedance come close to, for example, 100Ω, thereby facilitating impedance matching.

The cutout portions C may be also formed at a location overlapped with the first insulating layer 132 as viewed in a plan view. Thus, it is also possible to further reduce an electric capacity in the location overlapped with the first insulating layer 132 as viewed in a plan view. Further, the cutout portions C may be formed in a curved shape along wiring conductors 131, which are disposed in a curved shape. In addition, right-angled or acute-angled corner portions, as viewed in a sectional view, in a cross section transverse to the groove-shaped cutout portions C may be rounded in a curved shape. In this case, it is possible to inhibit a stress occurred in the cutout portions C under heat cycles during manufacturing processes, reliability test or the like of the electronic component housing package 10 from being concentrated at the corner portions.

Also, recess portions P may be provided so as to extend inward from a side surface of the first insulating layer 132 and also to be opened at a stacking surface thereof with the second insulating layer 133, thereby to be connected to opening portions of the cutout portions C.

Figure 8:
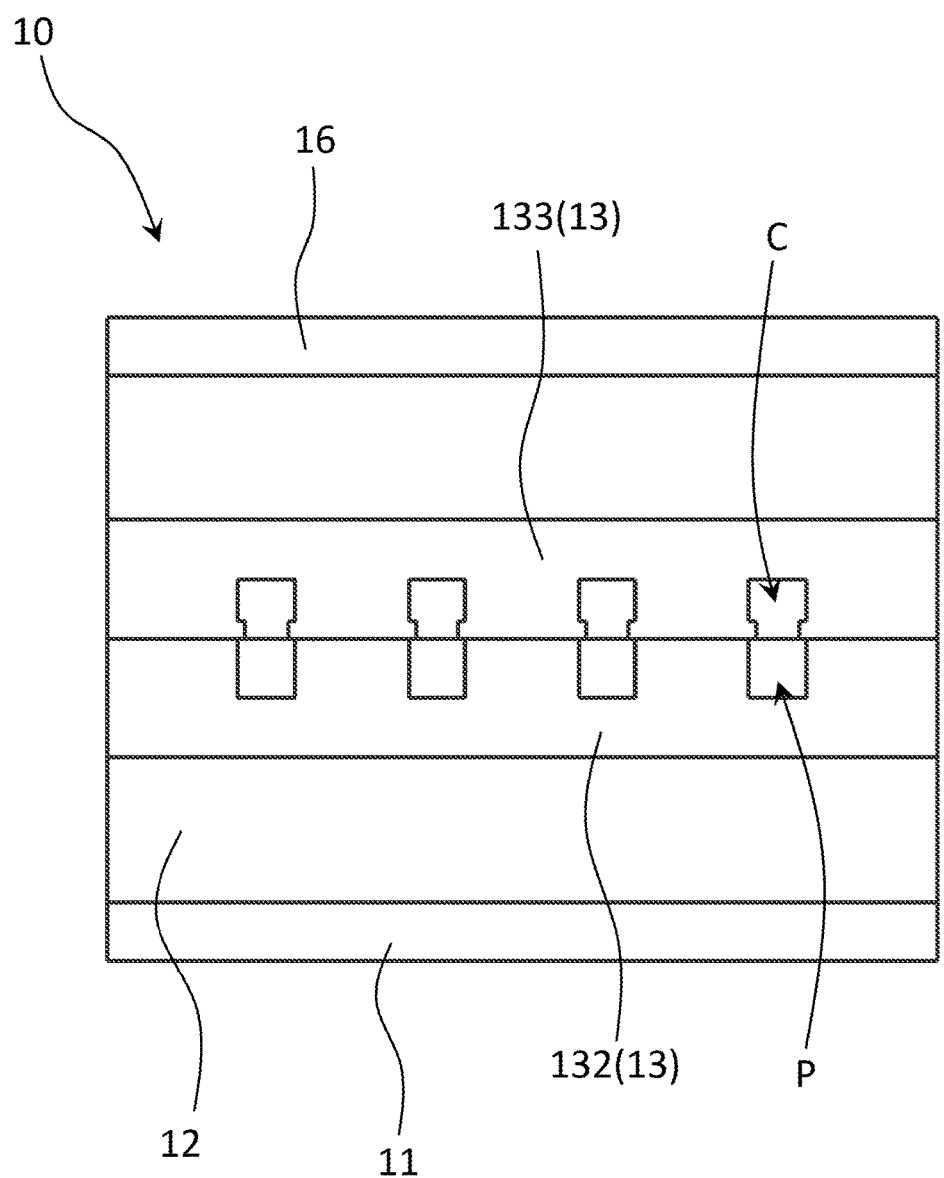
FIG. 8 is a front view of the electronic component housing package.

As shown in FIG. 8, the cutout portion C according to the present embodiment is cut out so that an inner side of the cutout portion C corresponding to an upper part thereof is wider than an opening portion of a lower part thereof. Namely, the cutout portion C is formed in such a two-stepped shape that the upper part thereof is larger than the lower part. For example, the lower part of the cutout portion C is set so that a length in a width direction thereof is 0.1 mm or more and 1 mm or less and a length in a vertical direction thereof is 0.1 mm or more and 0.5 mm or less. On the other hand, the upper part of the cutout portion C is set so that a length in a width direction thereof is 0.2 mm or more and 2 mm or less and a length in a vertical direction thereof is 0.1 mm or more and 1 mm or less. Also, the lower part of the cutout portion C is set so that a depth length thereof is 1 mm or more and 5 mm or less, and the upper part of the cutout portion C is set so that a depth length thereof is 1.1 mm or more and 6 mm or less. Herein, the depth length indicates a length as measured in a direction along the wiring conductors 131.

As shown in FIG. 4, in the present embodiment, the plurality of cutout portions C are provided. Three wiring conductors 131 between a pair of cutout portions C includes a signal line, a ground line and a signal line in this order from one cutout portion C toward the other cutout portion C. Namely, the signal lines are disposed on both sides of the cutout portion C.

The cutout portion C is opened so as to extend to edges of the signal lines formed on both sides of the cutout portion C. In addition, the upper part of the cutout portion having a wider width is formed so as to extend to locations overlapped with parts of the signal lines formed on both sides of the cutout portion C as viewed in a plan view. As the upper part of the cutout portion C has such a wider width, an electric capacity caused by a dielectric constant of the second insulating layer 133 can be further reduced.

Figure 2:
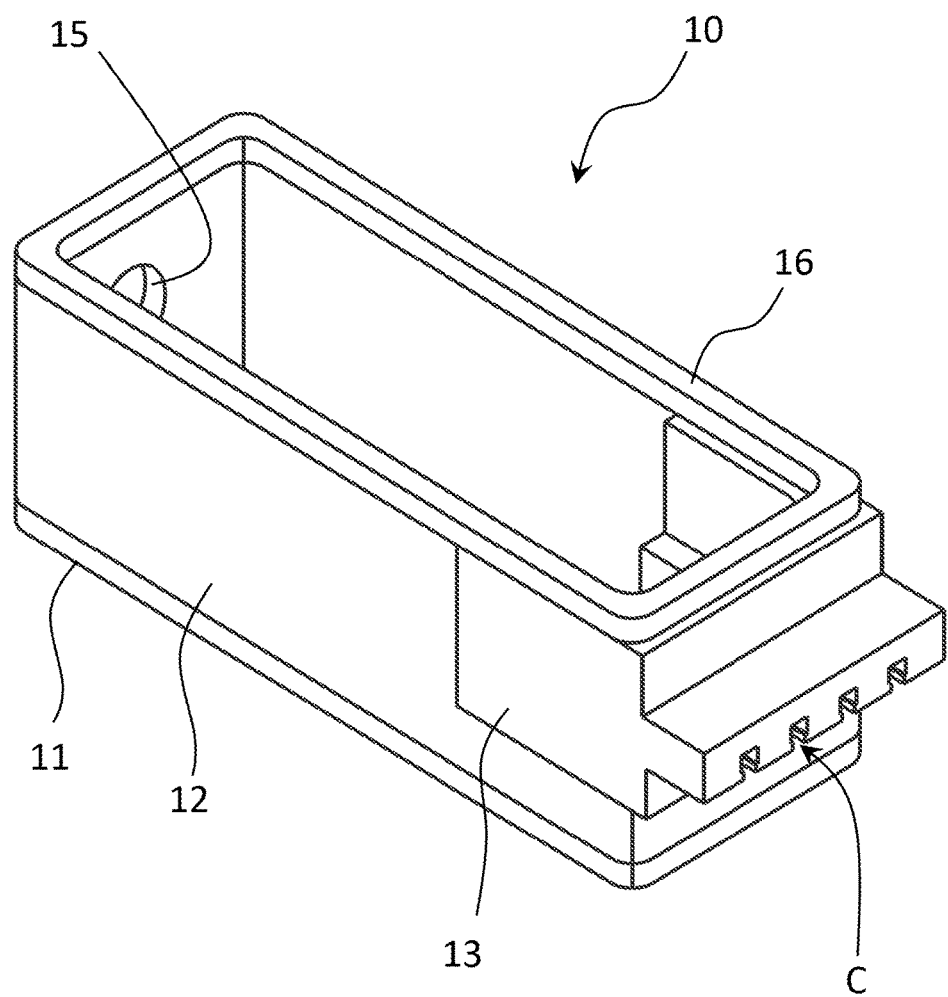
FIG. 2 is an external perspective view showing an electronic component housing package according to one embodiment of the invention, as obliquely viewed from above.
Figure 3:
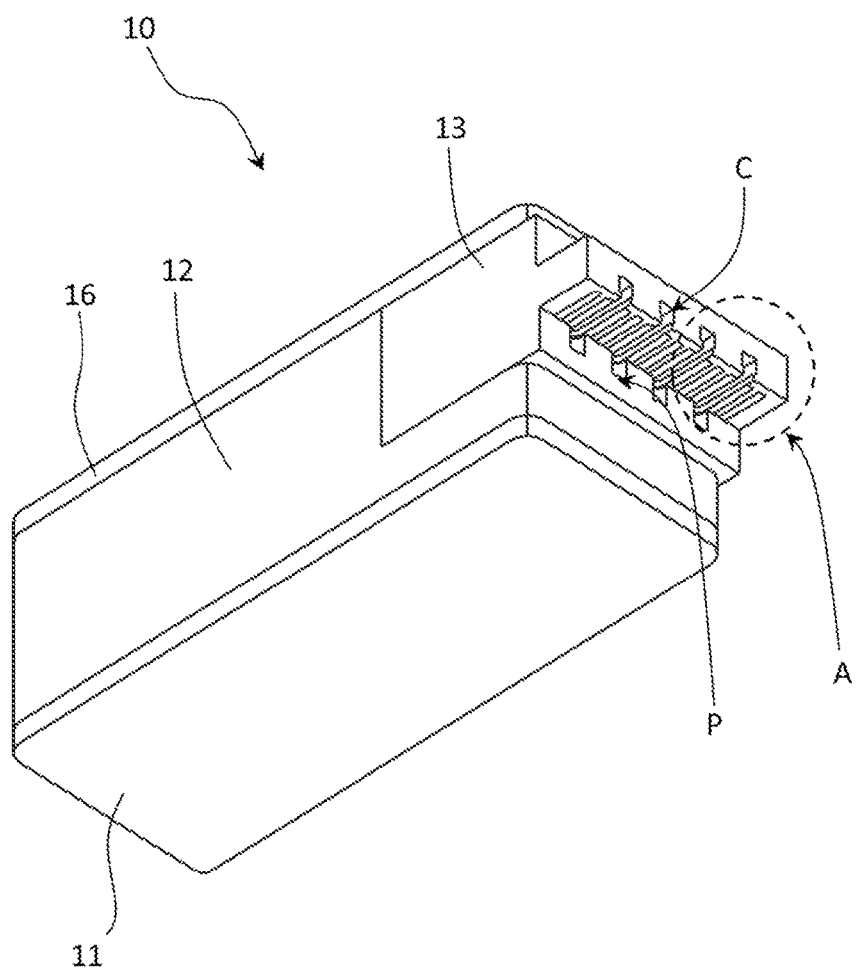
FIG. 3 is an external perspective view showing the electronic component housing package according to one embodiment of the invention, as obliquely viewed from below.

In one typical specific example, a capacitive component can be reduced as follows. For example, as shown in FIGS. 2, 3 and 4, alumina ceramic having a dielectric constant of 10 is employed for the second insulating layer 133, and two signal lines having a width of 0.2 mm are disposed on a surface thereof at a distance of 0.3 mm. Also, a cutout portion C having a width of 0.3 mm and a depth of 0.5 mm is provided between the two signal lines. Preferably, the cutout portion C may be formed in such a two-stepped shape that a width of the lower part is 0.3 mm, a depth of the lower part is 0.15 mm, a width of the upper part is 0.4 mm and a depth of the upper part is 0.35 mm. In this way, a capacitive component can be reduced and a matchable range of a characteristic impedance can be widened. A characteristic impedance of two signal lines, which is 25Ω if the cutout portion C is not provided, can be matched to 40Ω if the cutout portion C is of a one-stepped shape and also to 100Ω if the cutout portion C is of a two-stepped shape.

Also, the side surface of the first insulating layer 132 is provided with the recess portions P which lead to the cutout portions C. As shown in FIG. 8, the recess portions P are disposed directly below the cutout portions C. Each of the recess portions P is set so that a length in a width direction thereof is 0.2 mm or more and 2 mm or less. In this example, the recess portion P has the same width as the width of the upper part of the cutout portion C. The recess portion P is set so that a length in a vertical direction thereof is 0.1 mm or more and 1 mm or less. Also, the recess portion P is set so that a depth length thereof is 0.1 mm or more and 3 mm or less. Herein, the depth length means a length as measured in a direction along the wiring conductors 131.

By providing the recess portions P, it is possible to further reduce a capacitive component along wiring conductors 131 through which a high-frequency signal is transmitted. In addition, a characteristic impedance $\{Zo=\sqrt{(L/C)}\}$ can be increased. The recess portions P may be also configured so that corner portions created on an inner wall thereof is formed in a curved shape. Thus, it is possible to inhibit a stress occurred in the recess portions P under heat cycles during manufacturing processes, reliability test or the like of the electronic component housing package 10 from being concentrated at the corner portions.

Further, the recess portions P may be provided so as to be longer in a depth direction than that of the lower part of the cutout portions C as viewed in a plan view, namely to be wider in an inward direction from an outer surface of the frame body 12. Also, the recess portions P may be provided so as to have a wider width, so that the wiring conductors 131b disposed on the lower surface of the second insulating layer 133 can be exposed.

As a result, it is possible o inhibit capacity coupling between wiring conductors 131 through which a high-frequency signal is transmitted.

If a width of the upper part and a width of the lower part of the cutout portions C and a width of the recess portions P are different from each other, it is necessary to consider an order for stacking ceramic green sheets. For example, if the recess portions P have the widest width, it is preferable that a green sheet which becomes the second insulating layer 133 is firstly stacked and then the first insulating layer 132 in which the recess portions P are formed is stacked. In this way, a stacking pressure can be evenly applied so that separation is less prone to occur on such a stacked body.

Figure 6:
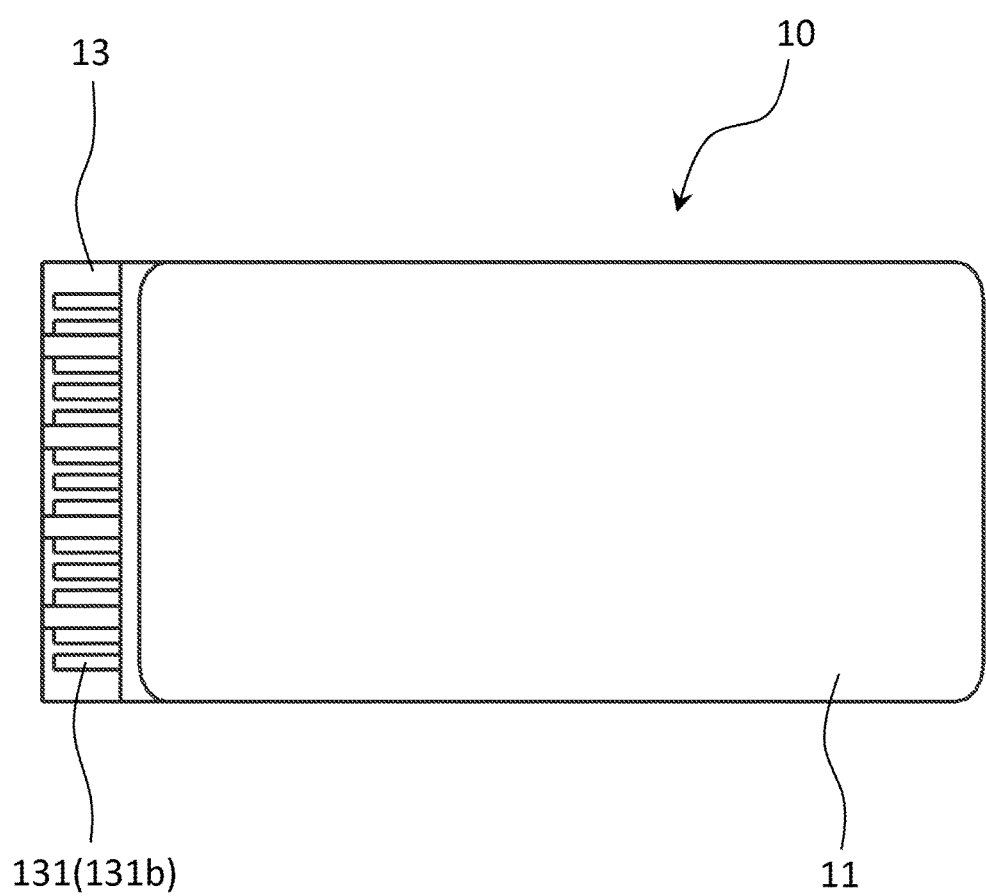
FIG. 6 is a bottom view of the electronic component housing package.

In the example of the present embodiment as shown in FIGS. 3, 4 and 6, the cutout portion C and the associated recess portion P are provided between two adjacent signal lines. The two adjacent signal lines are used as lines for transmitting differential signals.

Thus, if the cutout portion C and the recess portion P are disposed between two signal lines, a distance between the two signal lines can be reduced. Also, it is possible to reduce an electrostatic capacity created between one of the signal lines and the other signal line or ground conductors disposed therearound. In addition, when the external circuit board G as shown in FIG. 1 is electrically connected to the two signal lines via a conductive bonding material, each signal line can be inhibited from being short-circuited by the bonding material. Because the two signal lines are separated from each other by the cutout portion C, a bridge due to the bonding material is less prone to occur.

However, it is not necessary to limit arrangement of the cutout portion C and the recess portion P to a region between two signal lines.

For example, in a case where the cutout portion C and the recess portion P are disposed between a signal line and a ground line, a distance between the signal line and the ground line can be reduced. In addition, by narrowing a pitch between the signal line and the ground line, downsizing and high integration of the input/output member 13 can be realized.

Further, the wiring conductors 131a, 131b are not limited to a differential signal line. The wiring conductors may be a coplanar waveguide in which signal lines and ground lines are alternately disposed and thus each signal line is disposed between ground lines. In this case, cutout portions C and recess portions P can be disposed between each signal line and ground lines on both sides thereof, thereby reducing an electrostatic capacity created between the signal line and the ground lines. Therefore, even if an external circuit board G is connected thereto and thus a characteristic impedance is decreased, it is possible to adjust the characteristic impedance so as to have a proper value by arranging the cutout portions C and the recess portions P.

Further, the wiring conductors 131a, 131b may be a microstrip line, in which all conductors are signal lines. In this case, a cutout portion C and a recess portion P are disposed between adjacent signal lines, and thus when an external circuit board G is electrically connected to the two signal lines via a conductive bonding material, signal lines and ground lines can be inhibited from being short-circuited by the bonding material. Also, because an electrostatic capacity created between each signal line and ground lines therearound can be reduced as described above, a characteristic impedance of a connection portion between the external circuit board G and the signal lines can be increased. As a result, even if a characteristic impedance is decreased due to a decreased pitch of the signal lines, it is possible to adjust the characteristic impedance so as to have a desired value by providing the cutout portions C and the recess portions P, thereby realizing high integration of the signal lines.

Meanwhile, a line width of the wiring conductors 131a formed on the upper surface of the first insulating layer 132 is different from a line width of the wiring conductors 131b formed on the lower surface of the second insulating layer 133. Preferably, the line width of the wiring conductors 131a formed on the upper surface of the first insulating layer 132 is set to be narrower than the line width of the wiring conductors 131b. Also, the wiring conductors 131a are preferably disposed at a distance narrower than that of the wiring conductors 131b.

The wiring conductors 131a formed on the upper surface of the first insulating layer 132 are led out to the inside surrounded by the frame body 12. Bonding wires are connected to end portions of the wiring conductors 131a which are led out to the inside. Even if the wiring conductors 131a have a narrower width, the bonding wires can be electrically connected thereto.

On the other hand, the wiring conductors 131b formed on the lower surface of the second insulating layer 133 are connected to the external circuit board G. For example, in a case where the wiring conductors 131b is directly connected to the external circuit board G so as to be attached to each other as shown in FIG. 1, a certain line width is required to improve a bonding ability with the external circuit board G. Accordingly, the line width of the wiring conductors 131b formed on the lower surface of the second insulating layer 133 is preferably set to be wider than the line width of the wiring conductor 131a formed on the upper surface of the first insulating layer 132. Also, even if a metal wire, such as a lead terminal, is connected thereto, a wider line width is preferable.

The input/output member 131 is formed by stacking different green sheets and then sintering the sheets. For the wiring conductors 131a, a metallization paste which becomes the wiring conductors 131a after sintering, is printed on a green sheet which similarly becomes the first insulating layer 132 after sintering, and for the wiring conductors 131b, a metallization paste which becomes the wiring conductors 131b, is printed on a green sheet which becomes the second insulating layer 133. Then, when the green sheets are stacked, the wiring conductors 131a and the wiring conductors 131b are overlapped to come in close contact with each other, thereby forming the wiring conductors 131.

If a line width of one wiring conductors 131b is set to be wider than a line width of the other wiring conductors 131a in order to electrically connect both wiring conductors 131a and 131b to each other, an increased tolerance for misalignment can be provided, thereby facilitating connecting both wiring conductors to each other.

Also, if the wiring conductors 131b have a wider line width, a characteristic impedance thereof is decreased, as compared with a case of having a narrower line width. On the other hand, by providing the cutout portions C on the second insulating layer 133 and providing the recess portions P on the first insulating layer 132, the characteristic impedance of the wiring conductors 131b can be increased. Therefore, a change in characteristic impedance can be inhibited by adjusting sizes of the cutout portions C and the recess portions P so as to correspond to an amount of increase in line width of the wiring conductors 131.

Accordingly, the cutout portions C and the recess portions P are preferably provided so as to deeply extend to the vicinities of end positions of the wiring conductors 131a.

The electronic component 20 is mounted on the mount region R of the substrate 11. The electronic component 20 is electrically connected to the wiring conductors 131 of the input/output member 13 via a conductive member such as a bonding wire. Examples of the electronic component 20 can include an optical semiconductor device, IC (Integrated Circuit) device, a capacitor or the like. In the electronic device 1 of the present embodiment, an optical semiconductor device is employed as the electronic component 20. Examples of the optical semiconductor device include a light emitting device such as a LD (Laser Diode) device, or a light receiving device such as a PD (Photodiode) device.

A seal ring 16 having the same frame shape as that of the frame body 12 may be disposed on the frame body 12. In an example of the present embodiment, there is shown the seal ring 16 which is provided so as to continuously extend along the upper surface of the frame body 12 via a brazing material. The seal ring 16 connects the lid body 30 to the frame body 12 when the lid body 30 is provided so as to cover the inside of the frame body 12. The seal ring 16 is made of a material having a good welding ability with the lid body 30, for example, a metal such as copper, tungsten, iron, nickel or cobalt, or an alloy containing these metals. In addition, a thermal expansion coefficient of the seal ring 16 is set, for example, to $4 \times 10^{-6}$/K or more and $16 \times 10^{-6}$/K or less.

In the present embodiment, the through-hole portion H is formed between the frame body 12 and the seal ring 16 by cutting out a part of the upper surface of the frame body 12 and then bonding the seal ring 16 to the upper surface of the frame body 12. As in this example, the through-hole portion H may be provided by cutting out a part of the lower or upper surface of the frame body 12. In this case, the through-hole portion H is formed between the frame body 12 and the substrate 11 or between the frame body 12 and the seal ring 16 or the lid body 30. The seal ring 16 can be also considered as a part of the frame body 12. Further, the lid body 30 is disposed on the seal ring 16 so as to cover the electronic component 20 in the frame body 12. The lid body 30 is a member which air-tightly seals the electronic component 20 together with the substrate 11, the seal ring 16, the input/output member 13 and the frame body 12. The lid body 30 can air-tightly seal a region surrounded by the frame body 12. By sealing the electronic component 20 in this way, it is possible to inhibit deterioration of the electronic component 20 during use of the electronic component 20 over a long period of time.

The lid body 30 is made of, for example, a metal member such as copper, tungsten, iron, nickel or cobalt; an alloy or composite material containing these metals; or a ceramic material such as an aluminum oxide sintered body, a mullite sintered body, a silicon carbide sintered body, an aluminum nitride sintered body, a silicon nitride sintered body or glass ceramics.

The region which is air-tightly sealed by the lid body 30 may be in a vacuum state or may be filled with nitrogen gas or the like. The lid body 30 is mounted on the seal ring 16 and then is attached to the seal ring 16 by seam welding or the like. The lid body 30 may be attached to the seal ring 16 via a bonding material such as a brazing material, a glass bonding material or a resin bonding material.

The electronic device 1 includes the electronic component housing package 10, the electronic component 20 and the lid body 30. Specifically, the electronic device 1 includes the electronic component housing package 10, the electronic component 20 which is mounted on the mount region R of the electronic component housing package 10 and is connected to the wiring conductors 131 via a conductive member such as a bonding wire, and the lid body 30 bonded to the upper surface of the frame body 12 or the seal ring 16.

In the electronic component housing package 10 according to the present embodiment, the input/output member 13 has the cutout portions C which are cut out so as to extend from gaps between the plurality of wiring conductors 131 on the lower surface along the wiring conductors 131 to the outer side surface of the input/output member 13. Thus, an air layer is interposed between the wiring conductors 131, and even if wiring conductors 131 having a wider line width are disposed closely to each other, mismatching of a characteristic impedance can be mitigated. As a result, it is possible to provide the electronic component housing package 10 which has good electric properties, and the electronic device 1 employing the same.

Meanwhile, the invention is not limited to the forgoing embodiment, and thus various changes, modifications and the like are possible without departing from the scope of the invention.

<Method of Manufacturing Electronic Device>

Now, a method of manufacturing the electronic device 1 shown in FIG. 1 will be described.

First, the electronic component housing package 10 is prepared. The substrate 11, the frame body 12 and the seal ring 16 which constitute the electronic component housing package 10 are respectively manufactured in predetermined shapes by performing a conventionally well-known metal working process such as rolling or punching, on an ingot which is obtained by pouring a molten metal material into a mold and then solidifying the molten metal material.

Subsequently, the input/output member 13 is prepared. Herein, a method of manufacturing the input/output member 13 in a case where among ceramic materials such as an aluminum oxide sintered body, an aluminum nitride sintered body or a mullite sintered body, materials of the first insulating layer 132 and the second insulating layer 133 are an aluminum oxide sintered body will be described.

Specifically, first, an organic binder, a plasticizer, a solvent and the like are added and mixed into a raw material powder such as aluminum oxide, silicon oxide, magnesium oxide and calcium oxide, thereby preparing a slurry-state ceramic material.

Then, each of ceramic green sheets corresponding to the first insulating layer 132 and the second insulating layer 133 of the input/output member 13 is prepared. The ceramic green sheets can be manufactured by molding the slurry-state ceramic material into a sheet shape.

The ceramic green sheets are respectively cut into predetermined shapes. For example, if two-stepped cutout portions C having a lower part and an upper part are employed, three ceramic green sheets which respectively become a bottom part, a lower side part and an upper side part of the cutout portions C, are prepared and then are stacked in a predetermined order after being respectively punched so as to have predetermined shapes of the cutout portions C.

Subsequently, a metal paste containing a metal powder such as molybdenum or manganese, an organic binder, an organic solvent and the like is prepared. Then, the metal paste is applied on the ceramic green sheets into a wiring pattern and other predetermined metallization pattern which become the wiring conductors 131 or through-conductors, for example, using a screen printing process.

Finally, the ceramic green sheets which have been stacked in a predetermined order are fired, thereby manufacturing the input/output member 13.

A metallization pattern is formed on a site of the input/output member 13 which site becomes a bonding surface to the substrate 11 or the frame body 12, and then the input/output member 13 can be bonded to the frame body 12 or the like at the metallization pattern via a brazing material. Also, in addition to the input/output member 13, the substrate 11, the frame body 12 and the seal ring 16 prepared are assembled and then bonded to each other via a brazing material, thereby manufacturing the electronic component housing package 10.

Further, the mounting board 14 which is provided with an electric wiring on the upper surface thereof as necessary, is installed on the mount region R of the electronic component housing package 10 via a solder. Also, the electronic component 20 is mounted on the mounting board 14, and then electrodes of the electronic component 20 and the electric wiring of the mounting board 14 are electrically connected to each other. Then, the electric wiring of the mounting board 14 and the wiring conductors 131 of the input/output member 131 in the frame body 12 are electrically connected to each other via a bonding wire or the like. Finally, the lid body 30 is attached to the frame body 12 via the seal ring 16 by seam welding or the like. In this way, the electronic device 1 can be fabricated.

REFERENCE SIGNS LIST

1: Electronic device
10: Electronic component housing package
11: Substrate
12: Frame body
13: Input/output member
131: Wiring conductor
132: First insulating layer
133: Second insulating layer
14: Mounting board
15: Optical member
16: Seal ring
20: Electronic component
30: Lid body
R: Mount region
H: Through-hole portion
C: Cutout portion
P: Recess portion
G: External circuit board

The invention claimed is:

1. An electronic component housing package, comprising:
a substrate comprising an upper surface including a mount region on which an electronic component is to be mounted;
a frame body disposed on the upper surface of the substrate surrounding the mount region, and comprising a through-hole portion which opens to an inside and outside of the frame body; and
an input/output member disposed on the frame body blocking the through-hole portion, comprising:

a plurality of wiring conductors which are to be electrically connected to the electronic component, the wiring conductors extending to the inside and outside of the frame body and also extending along a lower surface of the input/output member on the outside of the frame body; and a cutout portion which is cut out extending from a gap between the plurality of wiring conductors on the lower surface along the wiring conductors to an outer side surface of the input/output member, and which is formed in such a two-stepped shape that a width of an inner side of the cutout portion is larger than a width of an opening portion of the cutout portion which is located in a gap between the wiring conductors.

2. The electronic component housing package according to claim 1, wherein the input/output member is such configured that a second insulating layer is stacked on a first insulating layer, the second insulating layer protrudes beyond the first insulating layer toward the outside of the frame body, and the plurality of wiring conductors are disposed on a lower surface of the second insulating layer.

3. The electronic component housing package according to claim 2, wherein a side surface of the first insulating layer is provided with a recess portion which leads to the cutout portion.

4. An electronic device, comprising:
the electronic component housing package according to claim 1;
an electronic component which is mounted on the mount region of the electronic component housing package and is electrically connected to the wiring conductors via a connection member; and
a lid body which is bonded to an upper surface of the frame body and seals the electronic component.

* * * * *